United States Patent [19]
Brownell et al.

[11] Patent Number: 5,802,707
[45] Date of Patent: *Sep. 8, 1998

[54] CONTROLLED BONDLINE THICKNESS ATTACHMENT MECHANISM

[75] Inventors: Michael Brownell; Gregory Turturro, both of Chandler, Ariz.; Dan McCutchan, Redwood City, Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 626,630

[22] Filed: Mar. 28, 1996

[51] Int. Cl.$^6$ .............................. H05K 1/18; H05K 7/02; H05K 7/20; H05K 13/04
[52] U.S. Cl. ................................ 29/740; 29/741; 29/760; 29/841; 257/713; 257/719; 269/903; 361/705; 361/709; 361/720
[58] Field of Search .............................. 29/740, 741, 760, 29/840, 841; 174/16.3, 52.2; 165/80.3, 80.4; 269/903; 257/713, 719, 722; 361/699, 705, 707, 709, 715, 764, 720

[56] References Cited

U.S. PATENT DOCUMENTS

| | | | |
|---|---|---|---|
| 4,791,983 | 12/1988 | Nicol et al. | 361/699 X |
| 5,022,462 | 6/1991 | Flint et al. | 165/80.4 |
| 5,142,444 | 8/1992 | Matta et al. | 361/720 |
| 5,195,020 | 3/1993 | Suzuki et al. | 361/699 |
| 5,287,617 | 2/1994 | Murphy | 29/741 |
| 5,297,333 | 3/1994 | Kusaka | 29/840 |
| 5,332,463 | 7/1994 | Eberlein et al. | 269/903 X |
| 5,424,580 | 6/1995 | Tustaniwskyi et al. | 257/719 X |
| 5,430,611 | 7/1995 | Pastel et al. | 361/705 |
| 5,504,988 | 4/1996 | Avery et al. | 29/741 |

FOREIGN PATENT DOCUMENTS

| 1-152700 | 6/1989 | Japan | 29/741 |
|---|---|---|---|

*Primary Examiner*—Peter Vo
*Attorney, Agent, or Firm*—Blakely, Sokoloff, Taylor & Zafman

[57] ABSTRACT

A tool which accurately controls the thickness of a thermal grease applied to an integrated circuit that is mounted to a printed circuit board. The tool includes a bracket that supports the printed circuit board and the integrated circuit. A thermal grease is applied to the top surface of the integrated circuit. A lid is attached to the bracket to capture the printed circuit board. The lid has a platen that is separated from the integrated circuit by a space which has a predetermined thickness. The space defines the thickness of the thermal grease. Any excess thermal grease is pushed out of the space by the lid so that a consistent thickness of thermal grease is applied for each integrated circuit assembly. The bracket, lid, integrated circuit and printed circuit board can be mounted to a motherboard as a single integrated circuit module. Alternatively, the lid can be detached from the base so that the grease covered integrated circuit can be removed from the tool for subsequently assembly.

7 Claims, 2 Drawing Sheets

CONTROLLED BONDLINE THICKNESS ATTACHMENT MECHANISM

BACKGROUND OF THE INVENTION

1. Field of the Invention

The present invention relates to a tool/package that applies a consistent uniform layer of thermal grease to a top surface of an integrated circuit that is mounted to a printed circuit board.

2. Description of Related Art

Some integrated circuit packages contain a heat sink to facilitate removal of the heat generated by the circuits. To minimize the thermal impedance between the integrated circuit and the heat sink, it is desirable to mount the heat sink directly to the die. The surface roughness of the heat sink material may create a relatively high thermal impedance at the interface of the heat sink and the die. Thermal grease is typically applied to the surface of the integrated circuit to lower the thermal impedance of the die/heat sink interface. The thermal grease fills in the pits and asperities that reside in the surfaces of the heat sink and the integrated circuit to provide a direct thermal conductive path between the two package components. It is desirable to accurately control the thickness of the thermal grease. Too much thermal grease will increase the thermal impedance of the package. Too little thermal grease might not adequately fill the spaces between the heat sink and the integrated circuit. It would be desirable to provide a tool and resultant integrated circuit module that accurately control the thickness of thermal grease applied to an integrated circuit.

SUMMARY OF THE INVENTION

The present invention is a tool which accurately controls the thickness of a thermal grease applied to an integrated circuit that is mounted to a printed circuit board. The tool includes a bracket that supports the printed circuit board and the integrated circuit. A thermal grease is applied to the top surface of the integrated circuit. A lid is attached to the bracket to capture the printed circuit board. The lid has a platen that is separated from the integrated circuit by a space which has a predetermined thickness. The space defines the thickness of the thermal grease. Any excess thermal grease is pushed out of the space by the lid so that a consistent thickness of thermal grease is applied for each integrated circuit assembly. The bracket, lid, integrated circuit and printed circuit board can be mounted to a motherboard as a single integrated circuit module. Alternatively, the lid can be detached from the base so that the grease covered integrated circuit can be removed from the tool for subsequently assembly.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
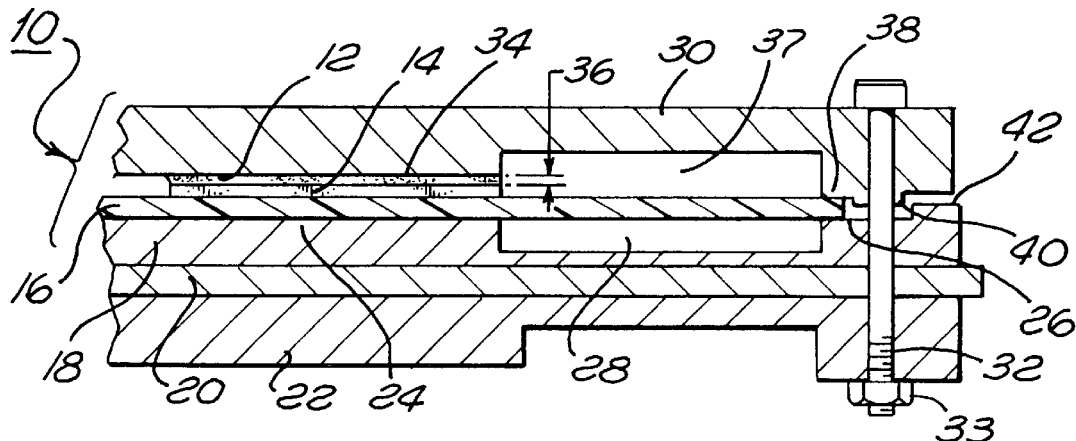
FIG. 1 is a side cross-sectional view of a tool of the present invention.
Figure 2:
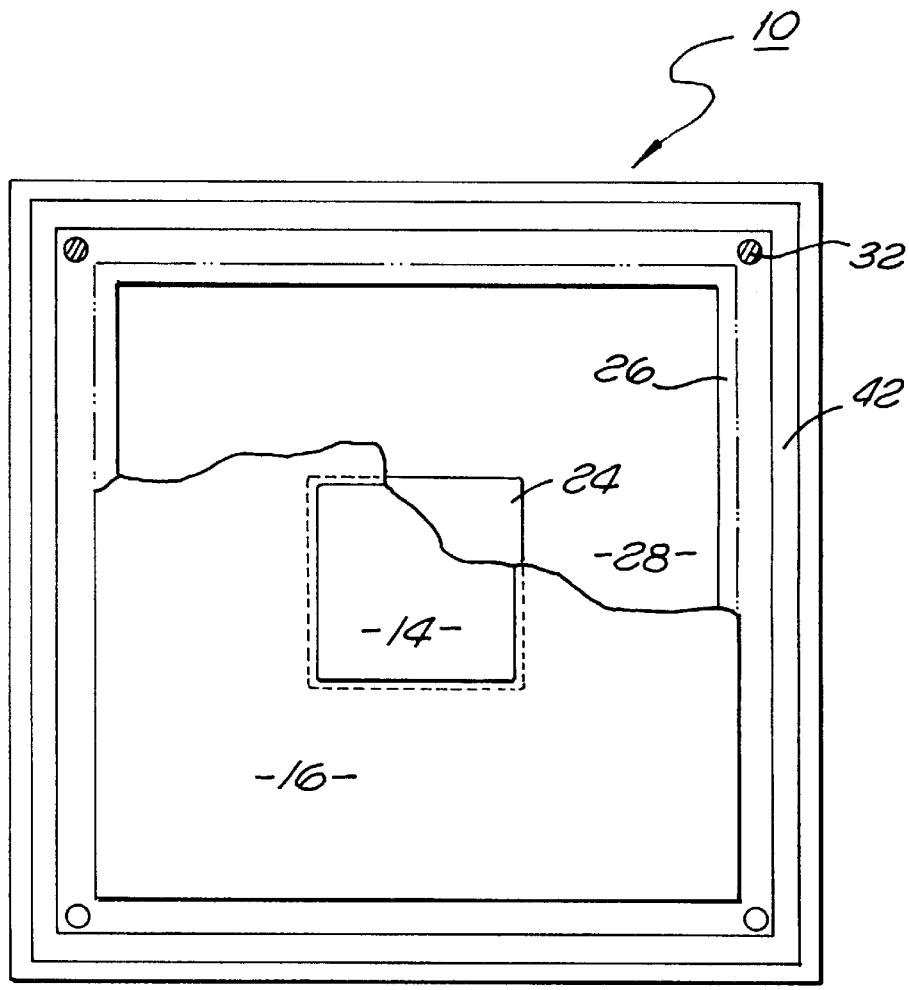
FIG. 2 is a top view of the tool without a lid attached thereto.

Referring to the drawings more particularly by reference numbers, FIGS. 1 and 2 show a tool 10 of the present invention. The tool 10 is typically used to control the thickness of a thermal grease 12 that is applied to the top surface of an integrated circuit 14. The integrated circuit 14 is mounted to a printed circuit board 16. Although a thermal grease 12 is shown and described, it is to be understood that the tool of the present invention may be used to control the thickness of any type of material that is applied to the top surface of the integrated circuit 14. The integrated circuit 14 is typically coupled to the printed circuit board 16 with conventional C4 flip chip processes.

The printed circuit board 16 is supported by a bracket 18. The bracket 18 may be stiffened by a base member 20 and a lower brace 22. The printed circuit board 16 rest on a center portion 24 of the bracket 18 and is supported at the ends by a land area 26 of the bracket. The center portion 24 of the bracket 18 has a small flatness tolerance to insure that the printed circuit board 16 lies flat within the tool 10. The bracket 18 may have a recess 28 to alleviate the flatness tolerances of the center portion 24. It being understood that it is more difficult to hold a flatness tolerance over a long surface area.

A lid 30 is attached to the bracket 18, base 20 and brace 22 by a plurality of fasteners 32. The fasteners 32 may be secured by a plurality of corresponding nuts 33. The lid 30 has a platen area 34 that is separated from the integrated circuit 14 by a space 36. The height of the space 36 defines the thickness of the thermal grease 12 that is applied to the integrated circuit 14. The platen area 34 also has a relatively low flatness tolerance. The lid 30 may have a recess 37 to improve the ability to meet the flatness tolerance.

The lid 30 has a lip 38 that cooperates with the land area 26 of the bracket 18 to capture the printed circuit board 16. The lip 38 also provides a datum zero point for the production of the lid 30. The platen area 34 is measured directly from the lip 38 so that there is only one tolerance between the top of the printed circuit board 16 and the platen area 34. The tolerances of the printed circuit board 16 thickness do not vary the height of the space 36 and thus provide a more accurate control of the grease 12.

The lid 30 has a key 40 that cooperates with a ridge 42 of the bracket 18 to prevent the lid 30 from moving in an x-y plane relative to the top surface of the integrated circuit 14. The key 40 has a height that is less than the thickness of the printed circuit board 16 so that the lip 38 always rest on the top surface of the circuit board 16. In operation, the lid 30 is separated from the bracket 18. The printed circuit board 16 and integrated circuit 14 are placed onto the bracket 18. A layer of thermal grease 12 is then applied to the top surface of the integrated circuit 14. The lid 30 is then placed over the printed circuit board 16 and attached to the bracket 18. The thermal grease 12 fills the space 36 between the platen area 34 of the lid 30 and the integrated circuit 14. Any excess thermal grease 12 is pushed away from the integrated circuit 14 by the lid 30 so that there is a consistent grease thickness for each integrated circuit 14. The thermal grease 12 is preferably initially applied thicker than the height of the space 36 to insure that the space 36 is completely filled with grease 12. The assembled tool 10 can be shipped to an end user. The end user can then detach the lid 30 and remove the printed circuit board 16 for subsequent assembly.

Figure 3:
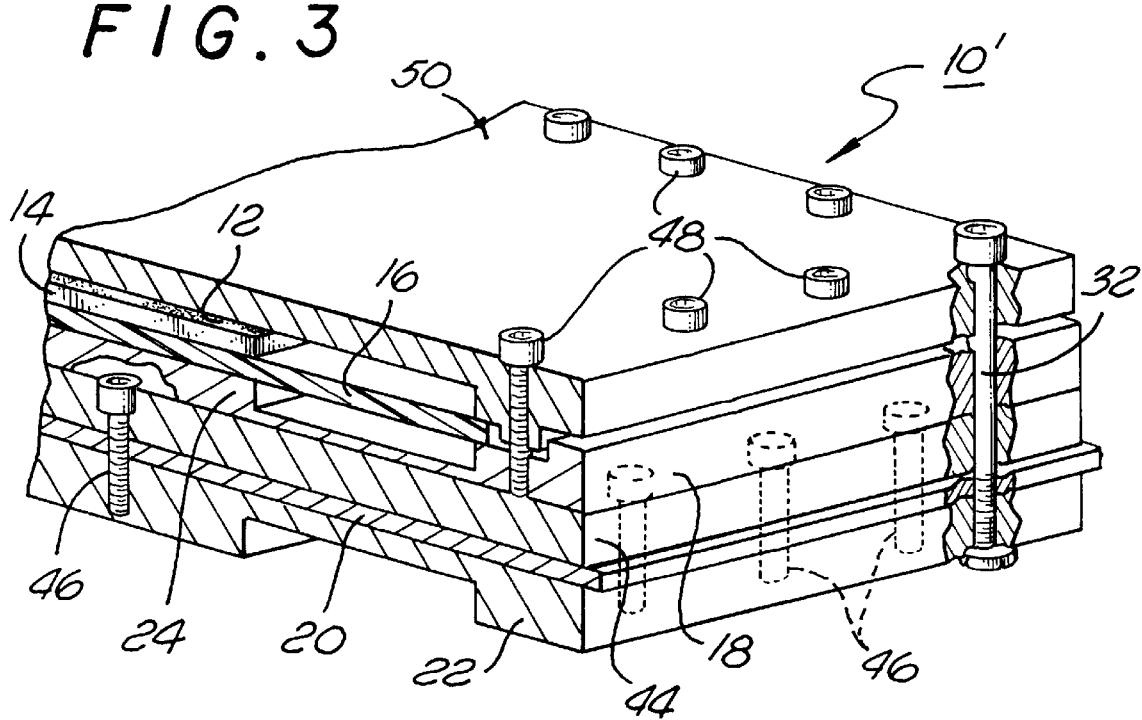
FIG. 3 is a perspective view of an alternate embodiment of the tool.

FIG. 3 shows an alternate embodiment of a tool 10' which has bottom bracket 44 located between the base 20 and bracket 18. This embodiment has three sets of fasteners 32, 46 and 48. One set of fasteners 46 couple the bottom bracket 44 to the base 20 and the brace 22. The second set of fasteners 48 attach the lid 30 to the bracket 18. The fasteners 32 secure the lid 30 and bracket 18 to the bracket 44, base 20 and brace 22 subassembly. The third set of fasteners 32 are typically located at the corners of the tool 10. The second set of fasteners 48 are located between the corner fasteners 32 about the periphery of the tool 10. After the thermal grease 12 is applied and the lid 30 is secured by fasteners 48 and 32, the corner fasteners 32 can be detached so that the lid 30, bracket 18, printed circuit board 16 and integrated circuit 14 can be removed as a module 50.

Figure 4:
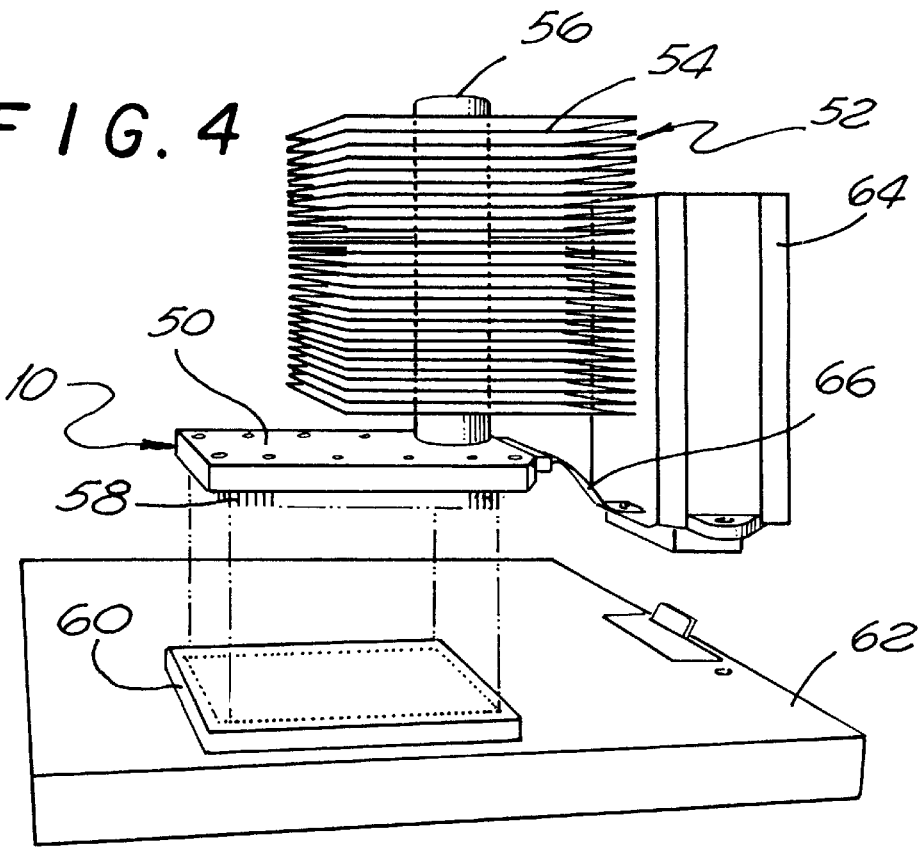
FIG. 4 is an exploded view of an integrated circuit module that can be coupled to a motherboard.

As shown in FIG. 4, a heat sink assembly 52 may be attached to the lid 30 of the module 50. The heat sink assembly 52 may include a plurality of fins 54 attached to a heat pipe 56. The printed circuit board 16 preferably contains a plurality of integrated circuits 14, whereby the board 16, circuits 14, lid 30 and bracket 18 comprise a multi-chip module (MCM).

The printed circuit board 16 may have a plurality of pins 58 that extend from the bottom of the board 16. The pins 58 may be plugged into a socket 60 that is mounted to a motherboard 62. The printed circuit board 16 may also be coupled to a power module 64 by a flexible cable 66.

The bracket 18 and lid 30 provide both a substrate for the printed circuit board 16 and integrated circuits 14, and a means to control the thickness of a thermal grease 12 that is applied to the integrated circuits 14.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A motherboard assembly, comprising;
   a motherboard;
   a socket that is mounted to said motherboard;
   a printed circuit board that is coupled to said socket, said printed circuit board having a top surface;
   an integrated circuit that is mounted to said top surface of said printed circuit board;
   a bracket that supports said printed circuit board;
   a lid that is attached to said bracket and in contact with said top surface of said printed circuit board, said lid having a platen area that is separated from said integrated circuit by a space; and,
   a thermal grease located within said space between said platen area and said integrated circuit.

2. The assembly as recited in claim 1, wherein said lid has a key that cooperates with a ridge of said bracket to limit a movement of said printed circuit board in a plane that is essentially parallel with a top surface of said integrated circuit.

3. The assembly as recited in claim 2, wherein said lid has a lip that captures said printed circuit board.

4. The assembly as recited in claim 3, wherein said bracket has a recess.

5. The assembly as recited in claim 4, wherein said lid and said bracket are coupled together by a plurality of fasteners.

6. The assembly as recited in claim 5, wherein said lid has a recess between said lip and said platen area.

7. The assembly as recited in claim 6, further comprising a heat sink that is mounted to said lid.

* * * * *